United States Patent
Park (10) Patent No.: US 8,362,619 B2
(45) Date of Patent: Jan. 29, 2013

(54) NONVOLATILE MEMORY DEVICE AND METHOD OF MANUFACTURING THE SAME

(75) Inventor: Sun Mi Park, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 297 days.

(21) Appl. No.: 12/773,259

(22) Filed: May 4, 2010

(65) Prior Publication Data

US 2010/0295185 A1 Nov. 25, 2010

(30) Foreign Application Priority Data

May 25, 2009 (KR) .......................... 10-2009-0045401

(51) Int. Cl.
 *H01L 23/48* (2006.01)

(52) U.S. Cl. ................ 257/773; 257/393; 257/E23.011; 257/E21.585; 257/E21.616; 438/672; 438/275; 438/618

(58) Field of Classification Search .................. 257/393, 257/E21.616, E23.011, E21.585
See application file for complete search history.

(56) References Cited

U.S. PATENT DOCUMENTS

| | | | | |
|---|---|---|---|---|
| 2002/0060351 A1* | 5/2002 | Shin et al. | ...................... | 257/536 |
| 2002/0135004 A1* | 9/2002 | Uh et al. | ........................ | 257/296 |
| 2006/0228852 A1* | 10/2006 | Chien | ........................... | 438/238 |
| 2009/0004793 A1* | 1/2009 | Chien | ........................... | 438/238 |
| 2009/0186477 A1* | 7/2009 | Shin et al. | ...................... | 438/618 |

FOREIGN PATENT DOCUMENTS

| | | |
|---|---|---|
| JP | 2005-235891 A | 9/2005 |
| JP | 2008-192891 A | 8/2008 |
| KR | 10-2006-0069030 | 6/2006 |
| KR | 10-2006-0124433 | 12/2006 |

* cited by examiner

*Primary Examiner* — Mamadou Diallo (74) *Attorney, Agent, or Firm* — Marshall, Gerstein & Borun LLP (57) ABSTRACT

A nonvolatile memory device comprises a semiconductor substrate comprising alternating, parallel active regions and isolation regions; first and second selection lines intersecting the active regions and the isolation regions; first junctions formed in the active regions between the first and second selection lines; spacers formed on sidewalls of the first and second selection lines; second junctions deeper than the first junctions formed in the first junctions, respectively; contact plugs coupled to one side of the respective second junctions; and dummy plugs coupled second sides of the respective second junctions.

15 Claims, 7 Drawing Sheets

NONVOLATILE MEMORY DEVICE AND METHOD OF MANUFACTURING THE SAME

CROSS-REFERENCE TO RELATED APPLICATION

Priority to Korean patent application number 10-2009-0045401 filed on May 25, 2009, the entire disclosure of which is incorporated by reference herein, is claimed.

BACKGROUND

Exemplary embodiments relate to a nonvolatile memory device and a method of manufacturing the same and, more particularly, to a nonvolatile memory device and a method of manufacturing the same, which are capable of improving passage of current from a signal line to a string structure.

NAND flash memory devices, a type of nonvolatile memory device facilitating higher capacity and higher degree of integration, have been actively developed. The memory cell array of the NAND flash memory device includes string structures arranged in a matrix form. Each of the string structures includes a drain select transistor having a drain coupled to a bit line, a source select transistor having a source coupled to a common source line, and a number of memory cells coupled in series. In the string structure, a number of the memory cells are coupled in series between the drain select transistor and the source select transistor. Meanwhile, neighboring string structures can be coupled together through the drain of the drain select transistor or the source of the source select transistor.

More particularly, a semiconductor substrate includes an isolation layers and active regions. The isolation layers and the active regions are alternately arranged in parallel in the memory cell array region. The string structures arranged in a row within one active region are coupled together through the source or the drain formed in the active region of the semiconductor substrate. For example, from among first to third string structures arranged in a row within one active region, the first and second string structures neighboring each other are coupled together through the drain of the drain select transistor. Furthermore, the second and third string structures neighboring each other are coupled together through the source of the source select transistor.

Meanwhile, the string structure is supplied with a drive signal through a signal line formed over an insulating layer. Here, a contact plug, coupled to the drain or the source, is formed in the insulating layer between the signal line and the string structure. Thus, the signal line formed over the insulating layer is electrically coupled to the string structure via the contact plug coupled to the drain or the source. For example, in the case in which the signal line is the bit line of a NAND flash memory device, the bit line is electrically coupled to the string structure via the contact plug coupled to the drain.

As described above, the signal line functions to supply an electrical signal to the string structure via the contact plug coupled to the source or the drain. In order to smoothly transfer current to the string structure, the source or the drain must be stably formed. However, the source or the drain can be lost in a process of manufacturing a nonvolatile memory device. Accordingly, there is a problem in that error is generated in the operations of the nonvolatile memory device because current is not smoothly transferred to the string structure.

BRIEF SUMMARY

An exemplary embodiment relates to a nonvolatile memory device and a method of manufacturing the same, which are capable of improving the occurrence of errors in the operation of the nonvolatile memory device by smoothing the passage of current from a signal line to a string structure.

Another exemplary embodiment relates to a nonvolatile memory device and a method of manufacturing the same, which are capable of preventing occurrence of a bridge between contact plugs and also improving passage of current from a signal line to a string structure formed on both sides of a junction.

A nonvolatile memory device according to an aspect of the disclosure comprises a semiconductor substrate comprising alternating, parallel active and isolation regions; first and second selection lines intersecting the active and isolation regions; first junctions formed in the active regions between the first and second selection lines; spacers formed on sidewalls of the first and second selection lines; second junctions deeper than the first junctions formed in the respective first junctions; contact plugs coupled to one side of the respective second junctions; and dummy plugs coupled a second side of the respective second junctions.

A method of manufacturing a nonvolatile memory device according to another aspect of the disclosure comprises providing a semiconductor substrate comprising parallel, alternative active and isolation regions; forming first and second selection lines intersecting the active and isolation regions; forming first junctions in the active regions between the first and second selection lines using the first and second selection lines as a mask; forming spacers on sidewalls of the first and second selection lines; forming second junctions deeper than the first junctions in the respective first junctions; forming contact plugs coupled to one side of the respective second junctions, and dummy plugs coupled to a second side of the respective second junctions.

Forming second junctions deeper than the first junctions in the respective first junctions preferably comprises forming, over the first junctions, a first interlayer dielectric layer comprising a first contact hole to expose the one side of the second junction and a dummy hole to expose the second side of the second junction and filling space between the first and second selection lines; and implanting impurity ions into the first junctions exposed through the first contact holes and the dummy holes.

Forming second junctions deeper than the first junctions in the respective first junctions preferably further comprises diffusing the impurity ions into the first junctions between the first contact holes and the dummy hole.

Diffusing the impurity ions into the first junctions between the first contact holes and the dummy hole preferably comprises performing an annealing process in a temperature range of 600° C. to 700° C.

Forming contact plugs coupled to one sides of the respective second junctions, and dummy plugs coupled to a second side of the respective second junctions preferably comprises forming, over the first junctions, a first interlayer dielectric layer comprising first contact holes, each exposing the one side of the second junction, and dummy holes, each exposing the second side of the second junction, and filling space between the first and second selection lines; forming first contact plugs filling the respective first contact holes and the dummy plugs filling the respective dummy holes; forming a second interlayer dielectric layer comprising second contact holes exposing the respective first contact plugs over the first interlayer dielectric layer comprising the first contact plugs and the dummy plugs; and forming second contact plugs filling the respective second contact holes.

The method preferably further comprises forming a bit line coupled to the first and second contact plugs over the second interlayer dielectric layer.

The contact plugs preferably are higher than the dummy plugs.

The contact plugs and the dummy plugs preferably are formed in each of the active regions between the first and second selection lines. The contact plugs and the dummy plugs formed between the first and second selection lines preferably are alternately adjacent to the respective first and second selection lines.

DESCRIPTION OF EMBODIMENTS

Hereinafter, exemplary embodiments of the disclosure are described in detail with reference to the accompanying drawings. The drawing figures are provided to allow those having ordinary skill in the art to understand the scope of the embodiments of the disclosure.

Figure 1:
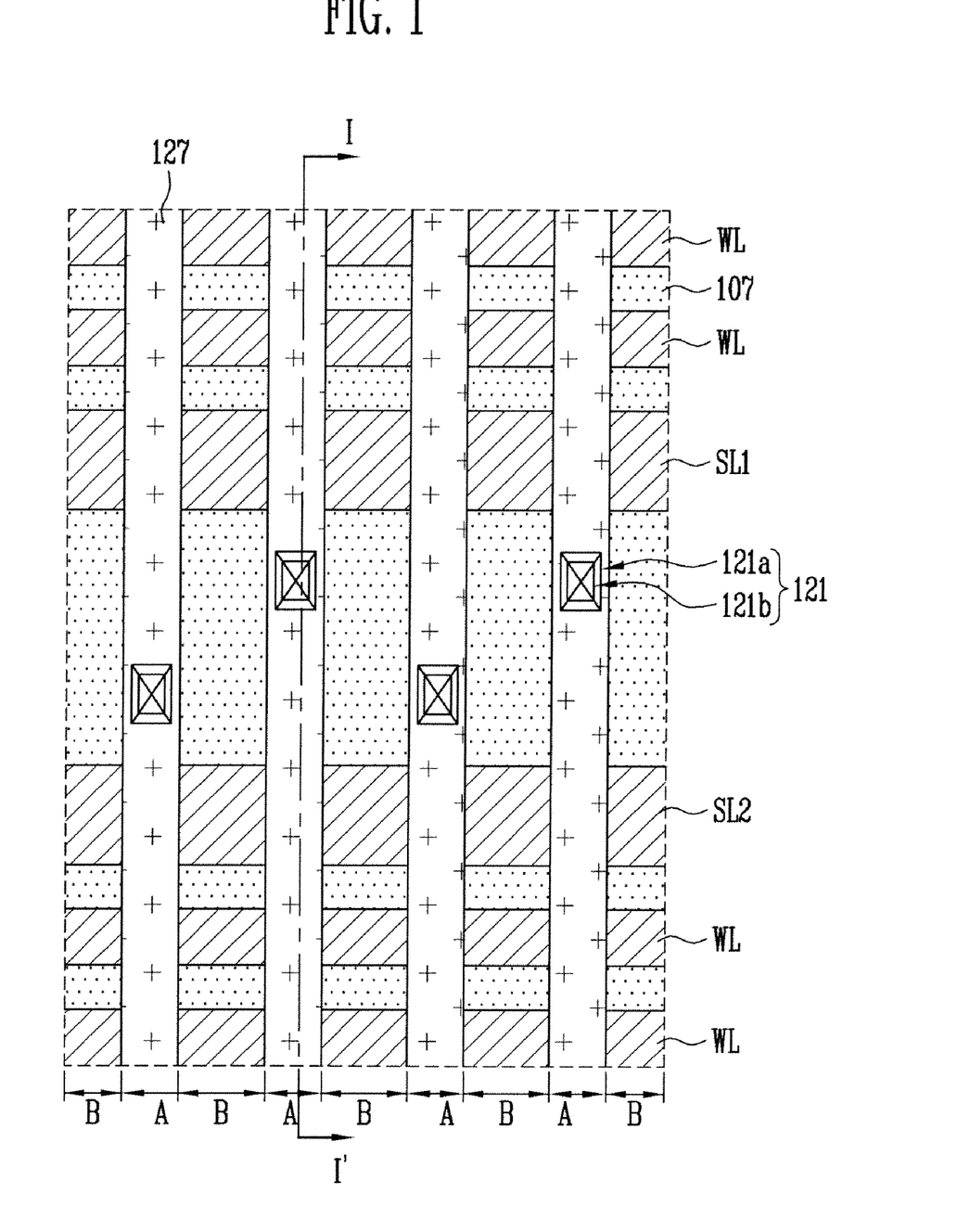
FIG. 1 is a layout diagram schematically showing part of the memory cell array of a nonvolatile memory device.
Figure 2:
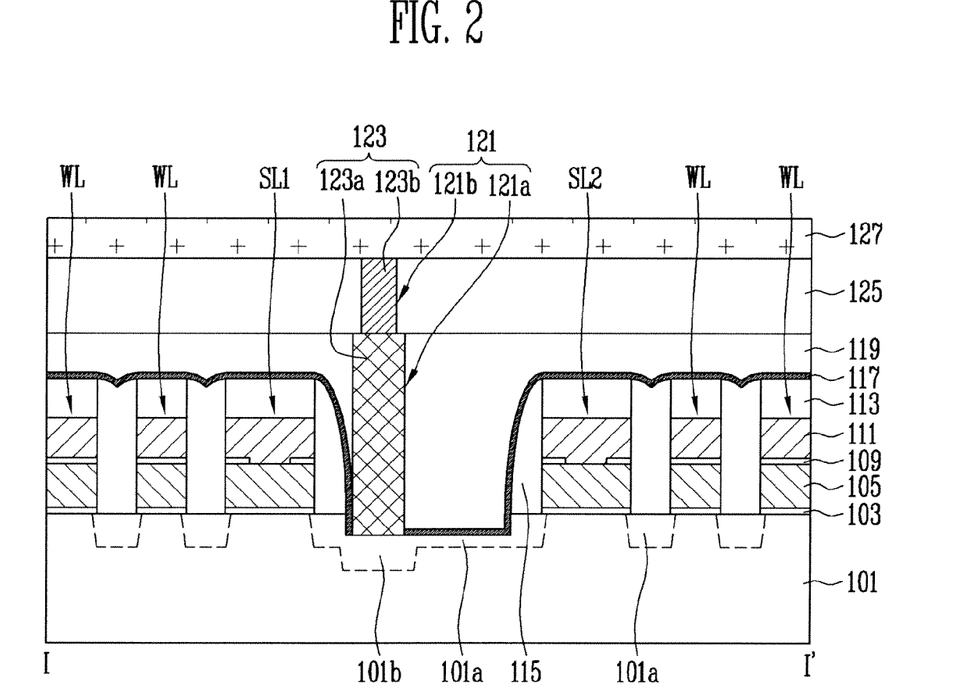
FIG. 2 is a cross-sectional view of the memory cell array taken along line I-I' shown in FIG. 1.

FIG. 1 is a layout diagram schematically showing part of a memory cell array of a nonvolatile memory device. FIG. 2 is a cross-sectional view of the memory cell array taken along line I-I' shown in FIG. 1. The nonvolatile memory devices shown in FIGS. 1 and 2 are NAND flash memory devices.

Referring to FIGS. 1 and 2, the gate of the NAND flash memory device is formed over a semiconductor substrate 101 with a gate insulating layer 103 interposed between the gate and the semiconductor substrate 101. The semiconductor substrate 101 includes active regions A and isolation regions B, which are parallel to each other and alternately arranged with respect to each other. An isolation layer 107 is formed in the isolation region B (FIG. 1).

Meanwhile, the gate has a structure in which a charge trap layer 105, a dielectric layer 109, and a control gate 111 are stacked. The gate is formed over the active region A. Furthermore, a gate hard mask pattern 113 may remain on the top of the stack gate. The gate hard mask pattern 113 is used as an etch barrier in an etch process of forming the stack gates. The control gates 111 of the stack gates are coupled to the active regions A and the isolation regions B, thereby forming a first selection line SL1, a second selection line SL2, or word lines WL. The first and second selection lines SL1, SL2 and the word lines WL intersect the active regions A and the isolation regions B. The first and second selection lines SL1, SL2 may be source selection lines, which couple source select transistors together, or drain selection lines, which couple drain select transistors together. Furthermore, the first and second selection lines SL1, SL2 are adjacent to each other. A number of the word lines WL are formed on both sides of the first and second selection lines SL1, SL2, which are adjacent to each other.

A first junction 101a is formed between the first and second selection lines SL1, SL2, between the word lines WL, between the first selection line SL1 and the word line WL, and between the second selection line SL2 and the word line WL. The first junctions 101a are formed by implanting impurity ions into the active region A using the first and second selection lines SL1, SL2 and the word lines WL as a mask. The first junctions 101a may be partially lost in a process of forming spacers 115 on the sidewalls of the first and second selection lines SL1, SL2 and the word lines WL. Meanwhile, in the case of memory cells designed to be 40 nm or less in size for the purpose of higher integration, the first junctions 101a have a shallow depth to prevent the deepening of a short channel effect. If, as described above, the depth of the first junctions 101a is too shallow, the degree of loss of the first junctions 101a resulting from the process of forming the spacers 115 can increased.

The spacers 115 can prevent the gates from being exposed in a process of forming contact holes 121. Meanwhile, to more effectively prevent the gates from being exposed in the process of forming the contact holes 121, an etch-stop layer 117 can be further formed on a surface of the spacers 115, a top surface of the gate hard mask patterns 113, and a surface of a first junction 101a exposed between the spacers 115.

In the case in which the contact holes 121 are drain contact holes formed between the drain selection lines, the contact holes 121 preferably are not arranged in a row to prevent a bridge between the contact plugs resulting from the high degree of integration of devices. More particularly, the contact holes 121 formed between the first and second selection lines SL1, SL2 are divided into contact holes adjacent to the first selection line SL1 and contact holes adjacent to the second selection line SL1 in order to prevent a bridge between the contact plugs. The contact holes adjacent to the first selection line SL1 and the contact holes adjacent to the second selection line SL1 are alternately arranged. That is, the contact holes 121 formed between the first and second selection lines SL1, SL2 preferably are formed so that they are alternately adjacent to the first and second selection lines SL1, SL2 in order to prevent a bridge between the contact plugs. Each of the contact holes 121 includes a first contact hole 121a and a second contact hole 121b. The first contact hole 121a is formed by etching a first interlayer dielectric layer 119 and the etch-stop layer 117 formed over the first junction 101a. The second contact hole 121b is formed by etching a second interlayer dielectric layer 125 formed over the first contact hole 121a.

The first contact hole 121a is formed by etching the first interlayer dielectric layer 119 and the etch-stop layer 117 formed over the first junction 101a, thereby exposing the first junction 101a. A second junction 101b is formed by implanting impurity ions through the first contact hole 121a exposing the first junction 101a as described above. The second junction 101b is deeper than the first junction 101a, and so can supplement the depth of one side of the lost first junction 101a. Accordingly, although the depth of the first junction 101a is shallow in order to reduce the short channel effect, the loss of one side of the first junction 101a can be compensated for by the second junction 101b. After the second junction 101b is formed, the inside of the first contact hole 121a is filled with a first contact plug 123a.

The second contact hole 121b is formed by etching the second interlayer dielectric layer 125 formed over the first contact hole 121a, thereby exposing the first contact plug 123a. The inside of the second contact hole 121b exposing the first contact plug 123a as described above is filled with a second contact plug 123b.

In the case in which the contact holes 121 are formed so that they are alternately adjacent to the first and second selection lines SL1, SL2, the contact plugs 123, each configured to include the first and second contact plugs 123a, 123b and formed between the first and second selection lines SL1, SL2, are also formed so that they are alternately adjacent to the first and second selection lines SL1, SL2. Accordingly, the shortest distance between the neighboring contact plugs 123 is large as compared with a case in which the contact plugs 123 are arranged in a row, and so formation of a bridge between the contact plugs 123 can be prevented.

Meanwhile, the contact plug 123 is coupled to a signal line 127 formed over the second interlayer dielectric layer 125. Thus, the signal line 127 is electrically coupled to the first and second junctions 101a, 101b between the first and second selection lines SL1, SL2 via the contact plug 123. In the case in which the first and second selection lines SL1, SL2 are the drain selection lines, the signal line 127 is a bit line.

The second junction 101b can compensate for the loss of one side of the first junction 101a, which may occur in the process of forming the spacers 115. Thus, passage of current from the signal line 127 to a string structure, coupled to one side of the first junction 101a, through the first and second junctions 101a, 101b can be facilitated. In the method of FIGS. 1 and 2, however, the loss of the other side of first junction 101a in which the second junction 101b is not formed cannot be compensated for. Consequently, passage of current to a string structure coupled to the other side of the first junction 101a may not be smooth.

A nonvolatile memory device and a method of manufacturing the same according to an exemplary embodiment of the disclosure, which are capable of making smooth passage of current to a string structure coupled to both sides of the first junction 101a, are described below.

Figure 3:
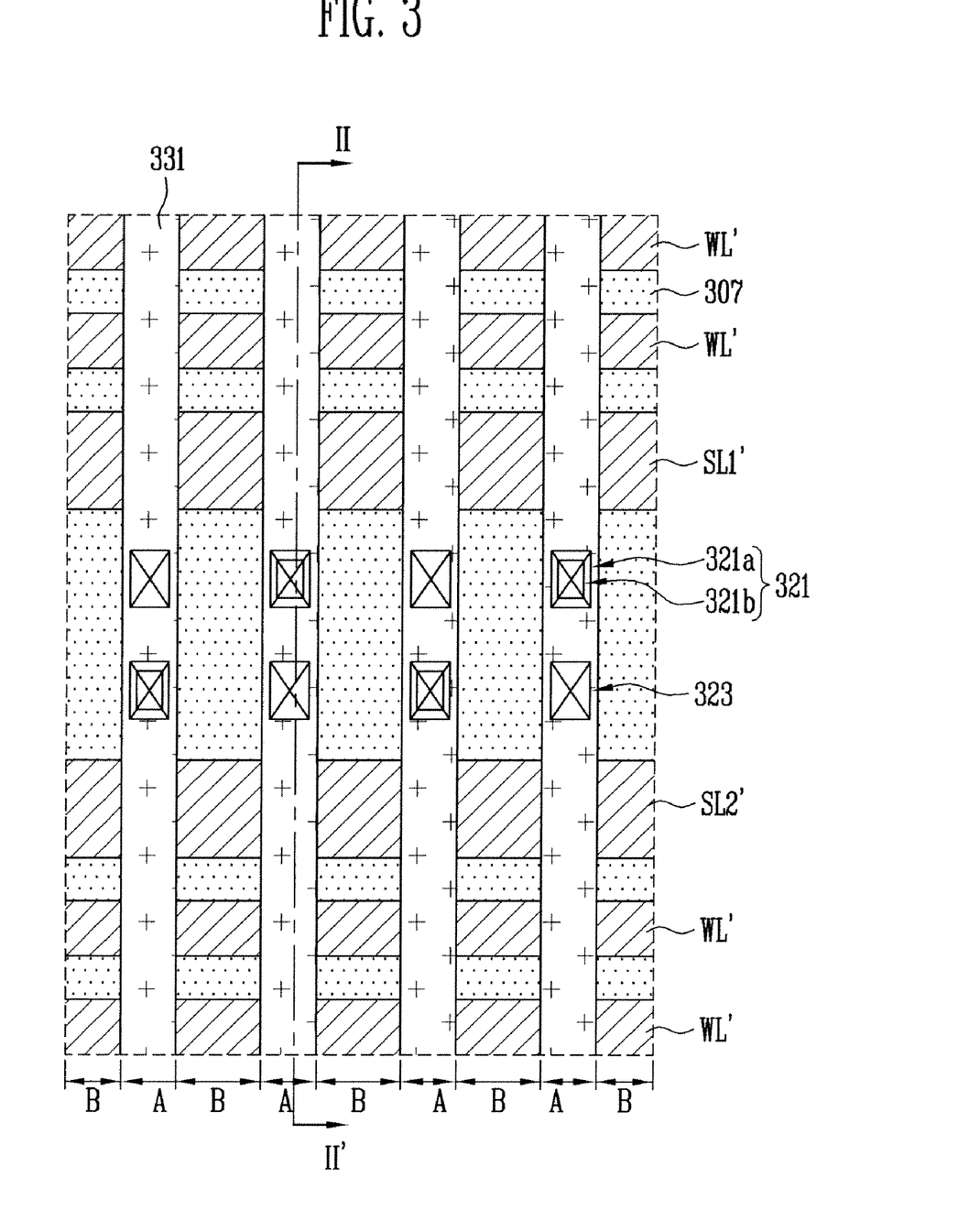
FIG. 3 is a layout diagram schematically showing part of the memory cell array of a nonvolatile memory device according to an exemplary embodiment of this disclosure.

FIG. 3 is a layout diagram schematically showing part of a memory cell array of a nonvolatile memory device according to an exemplary embodiment of this disclosure. The nonvolatile memory device shown in FIG. 3 is a NAND flash memory device.

Referring to FIG. 3, the memory cell array of the NAND flash memory device according to the exemplary embodiment of this disclosure includes word lines WL' and first and second selection lines SL1', SL2' which are arranged in parallel. The first and second selection lines SL1', SL2' are adjacent to each other, and the word lines WL' are formed on both sides of the first and second selection lines SL1', SL2'. The first and second selection lines SL1', SL2' may be source selection lines that couple source select transistors together, or drain selection lines that couple drain select transistors together. The first and second selection lines SL1', SL2' and the word lines WL' are formed over a semiconductor substrate, including parallel, alternating isolation regions B and active regions A, and intersect the isolation regions B and the active regions A.

The isolation regions B of the semiconductor substrate are regions in which isolation layers 307 are formed. The active regions A are separated from each other with the isolation layers 307 interposed therebetween. The source select transistor or the drain select transistor coupled to the first and second selection line SL1', SL2' is supplied with an electrical signal from a signal line 331 via contact plugs, each of which is coupled to one side of the active region A between the first and second selection lines SL1', SL2'. Here, in the case in which the first and second selection lines SL1', SL2' are drain selection lines, the signal line 331 is a bit line of the NAND flash memory device.

A contact plug is formed within a contact hole 321, exposing one side of the active region A between the first and second selection lines SL1', SL2'. In particular, in the case in which the first and second selection lines SL1', SL2' are the drain selection lines, the contact holes 321 preferably are not arranged in a row to prevent a bridge between neighboring contact plugs. More particularly, the contact holes 321 formed between the first and second selection lines SL1', SL2' are divided into contact holes adjacent to the first selection line SL1' and contact holes adjacent to the second selection line SL2' in order to prevent a bridge between the contact plugs. Furthermore, the contact holes adjacent to the first selection line SL1' and the contact holes adjacent to the second selection line SL2' are alternately arranged. In other words, the contact holes 321 formed between the first and second selection lines SL1', SL2' preferably are formed so that they are alternately adjacent to the first and second selection lines SL1', SL2' in order to prevent a bridge between the contact plugs. Each of the contact holes 321 can include a first contact hole 321a and a second contact hole 321b formed in different interlayer dielectric layers.

Meanwhile, in the exemplary embodiment of the disclosure, dummy holes 323 are further included in order to prevent formation of a bridge between the contact plugs and also to more effectively improve passage of current from the signal line 331 to a string structure coupled to both sides of the contact hole 321. The dummy hole 323 is formed to expose the other side of the active region A between the first and second selection lines SL1', SL2'. A dummy plug is formed within the dummy hole 323. Furthermore, the dummy plugs are electrically insulated from the signal line 331.

As described above, in the exemplary embodiment of the disclosure, in order to prevent formation of a bridge between the contact plugs, the contact holes 321 are formed so that they are alternately adjacent to the first and second selection lines SL1', SL2'. Accordingly, each of the contact holes 321 is formed only on one side of the active region A between the first and second selection lines SL1', SL2'. Moreover, in the exemplary embodiment of the disclosure, each of the dummy holes 323 is formed on the other (second) side of the active region A between the first and second selection lines SL1', SL2'. In the exemplary embodiment of the disclosure, in the case in which the contact hole 321 is formed only on one side of the active region A between the first and second selection lines SL1', SL2', the dummy hole 323 functions to more effectively improve passage of current to a string structure coupled to both sides of the contact plug.

Meanwhile, the position where the dummy hole 323 is formed depends on the position where the contact hole 321 is formed. Further, the contact holes 321 formed between the first and second selection lines SL1', SL2' are formed so that they are alternately adjacent to the first and second selection lines SL1', SL2' in order to prevent a bridge between the contact plugs. Thus, the dummy holes 323 preferably are formed so that they are alternately adjacent to the first and second selection lines SL1', SL2' depending on the positions where the contact holes 321 are formed. If the contact hole 321 is formed adjacent to the first selection line SL1' over the active region A formed between the first and second selection lines SL1', SL2', the dummy hole 323 is also formed adjacent to the second selection line SL2'. On the other hand, if the contact hole 321 is formed adjacent to the second selection line SL2' over the active region A formed between the first and second selection lines SL1', SL2', the dummy hole 323 is formed adjacent to the first selection line SL1'.

A method of manufacturing the NAND flash memory device according to an exemplary embodiment of this disclosure is described below with reference to FIG. 3 and FIGS. 4A to 4G. Further, the effects of the NAND flash memory device according to the exemplary embodiment of this disclosure are described in detail. FIGS. 4A to 4G are cross-sectional views of the memory cell array taken along line II-II' shown in FIG. 3.

Figure 4A:
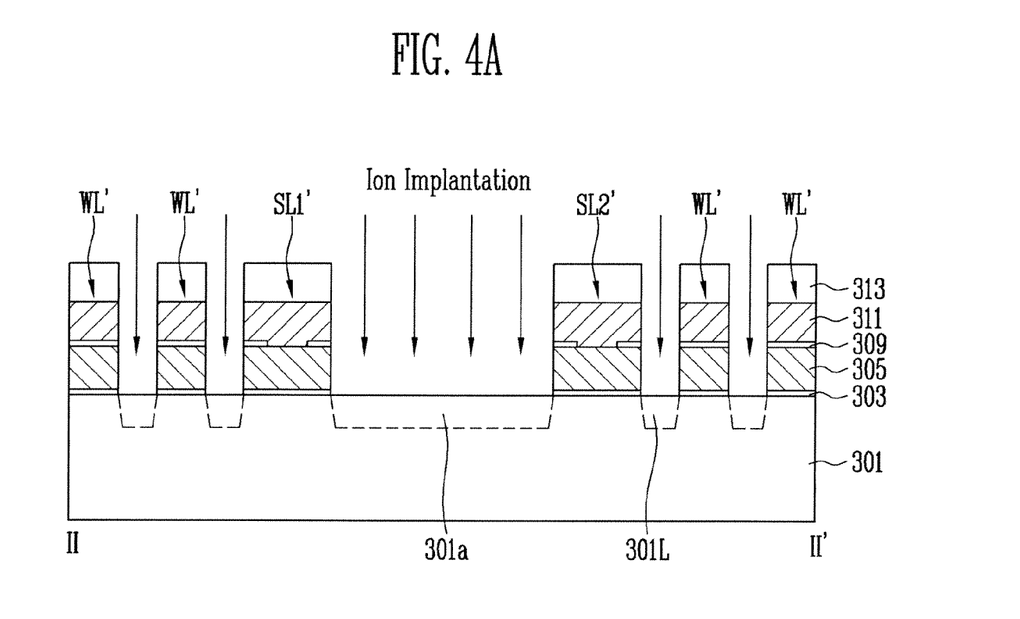
FIGS. 4A to 4G are cross-sectional views of the memory cell array taken along line II-II' shown in FIG. 3.

Referring to FIGS. 3 and 4A, a gate insulating layer 303, a charge trap layer 305, a dielectric layer 309, and a control gate layer 311 are formed over a semiconductor substrate 301 in which a well (not shown) has been formed and on which an ion implantation process for controlling a threshold voltage has been performed. The gate insulating layer 303 preferably is formed of an oxide layer. The charge trap layer 305 preferably is formed of a polysilicon layer. For example, the charge trap layer 305 preferably is a doped polysilicon layer or a stack of a doped polysilicon layer and an undoped polysilicon layer.

Meanwhile, the isolation layers 307 are formed in the isolation regions B of the semiconductor substrate 301. For example, the isolation layers 307 preferably are formed by forming trenches, after the gate insulating layer 303 and the charge trap layer 305 are formed, and then filling the inside of the trenches with an oxide layer. Thus, the isolation layers 307 are formed in the isolation regions B of the semiconductor substrate 301, and the gate insulating layer 303 and the charge trap layer 305 may remain over the active regions A of the semiconductor substrate 301.

After the isolation layers 307, the gate insulating layer 303, and the charge trap layer 305 are formed, the dielectric layer 309 preferably is formed on a surface of the isolation layers 307 and the charge trap layer 305. The dielectric layer 309 preferably is formed by stacking an oxide layer, a nitride layer, and an oxide layer. Furthermore, the dielectric layer 309 includes a dielectric layer contact hole exposing the charge trap layer 305 in regions in which the first and second selection lines SL1, SL2 will be formed. The dielectric layer contact hole can electrically couple the charge trap layer 305 and the control gate layer 311. The control gate layer 311 can have a single layer, including a polysilicon layer, or a dual layer, including a polysilicon layer and a metal layer.

A gate hard mask pattern 313 is formed on the control gate layer 311. The control gate layer 311, the dielectric layer 309, and the charge trap layer 305 are etched through an etch process using the gate hard mask pattern 313 as an etch barrier until the gate insulating layer 303 is exposed. Thus, stack gate patterns, including the word lines WL' and the first and second selection lines SL1', SL2', are formed. Thus, the control gate layer 311 is etched, and so the word lines WL' and the first and second selection lines SL1', SL2' are formed to cross the active regions A and the isolation layers 307. Furthermore, the charge trap layer 305 remaining over the active regions A is etched and so separated into a number of patterns over the respective active regions A.

Impurity ions are implanted into the active regions A of the semiconductor substrate 301 using the word lines WL' and the first and second selection lines SL1', SL2' as a mask. Thus, cell junctions 301L are formed in the active regions A on both sides of each of the word lines WL', and first junctions 301a are formed in the active regions A between the first and second selection lines SL1', SL2'. In the case in which the memory cells and the select transistors of a NAND flash memory device to be formed are NMOS, the impurity ions can include n-type impurity ions, such as phosphorous (P).

Figure 4B:
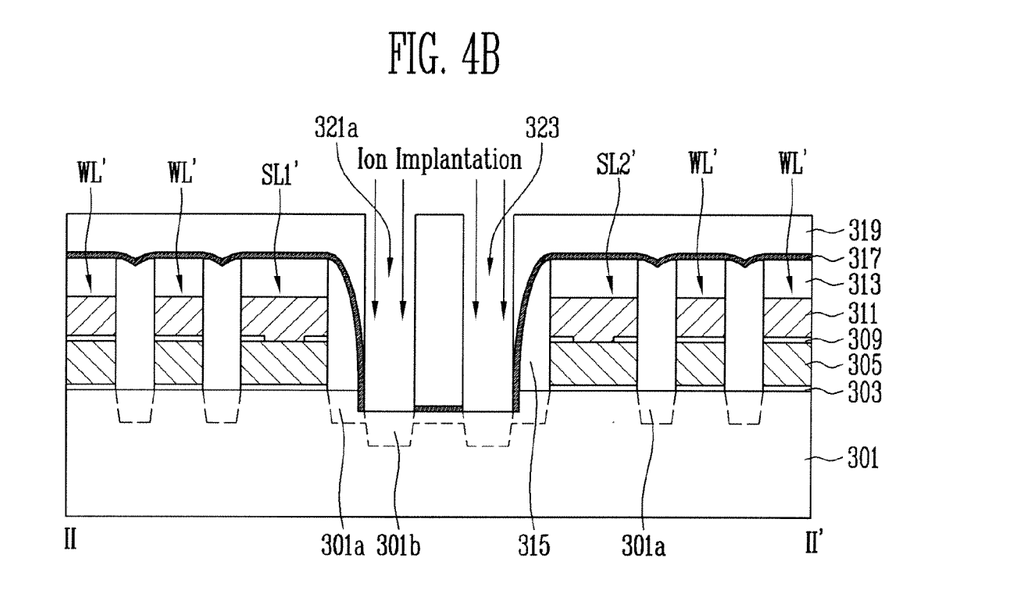

Referring to FIGS. 3 and 4B, spacers 315 for protecting the sidewalls of the word lines WL' and the first and second selection lines SL1', SL2' are formed. Since the space between the word lines WL' is narrower than the space between the first and second selection lines SL1', SL2', the space between the word lines WL' can be filled with the spacers 315.

The spacers 315 preferably is formed by forming a spacer layer on a surface of the semiconductor substrate 301, including the stack gate patterns including the first and second selection lines SL1', SL2', and performing an etch process so that the spacer layer remains only the sidewalls of the first and second selection lines SL1', SL2'. The spacer layer can be made of insulating material, such as oxides. The etch process preferably is performed using an etch-back process or a blanket etch process. In the case in which the first and second selection lines SL1', SL2' are drain selection lines, the first junctions 301a between the first and second selection lines SL1', SL2' can be lost because the distance between the first and second selection lines SL1', SL2' is wider than the distance between the word lines WL'. Meanwhile, the cell junctions 301L between the word lines WL' are not lost because the spacers 315 remain and so the semiconductor substrate 301 is not exposed.

After the spacers 315 are formed, an etch-stop layer 317 can be further formed on a surface of the spacers 315, the gate hard mask patterns 313, and the semiconductor substrate 301. The etch-stop layer 317 functions to prevent the sidewalls of the stack gates from being exposed in an etch process for forming the first contact holes 321a and the dummy holes 323. The etch-stop layer 317 preferably is a nitride layer.

A first interlayer dielectric layer 319 is formed on the etch-stop layer 317. The first interlayer dielectric layer 319 preferably is an oxide layer. The first interlayer dielectric layer 319 also fills the space between the first and second selection lines SL1', SL2'.

After the first interlayer dielectric layer 319 is formed, the etch-stop layer 317 and the first interlayer dielectric layer 319 formed over the first junctions 301a between the first and second selection lines SL1', SL2' are etched, thereby forming the first contact hole 321a exposing one side of the first junction 301a and the dummy hole 323 exposing the other side of the first junction 301a. The first contact hole 321a and the dummy hole 323 preferably is formed through an etch process using a photoresist pattern, patterned through a photolithography process, as an etch barrier.

Impurity ions are implanted into the first junction 301a exposed through the first contact hole 321a and the dummy hole 323, thereby forming second junctions 301b. The second junctions 301b compensate for the first junctions 301a, lost in the process of forming the spacers 315, and preferably have a depth deeper than the first junction 301a.

Figure 4C:
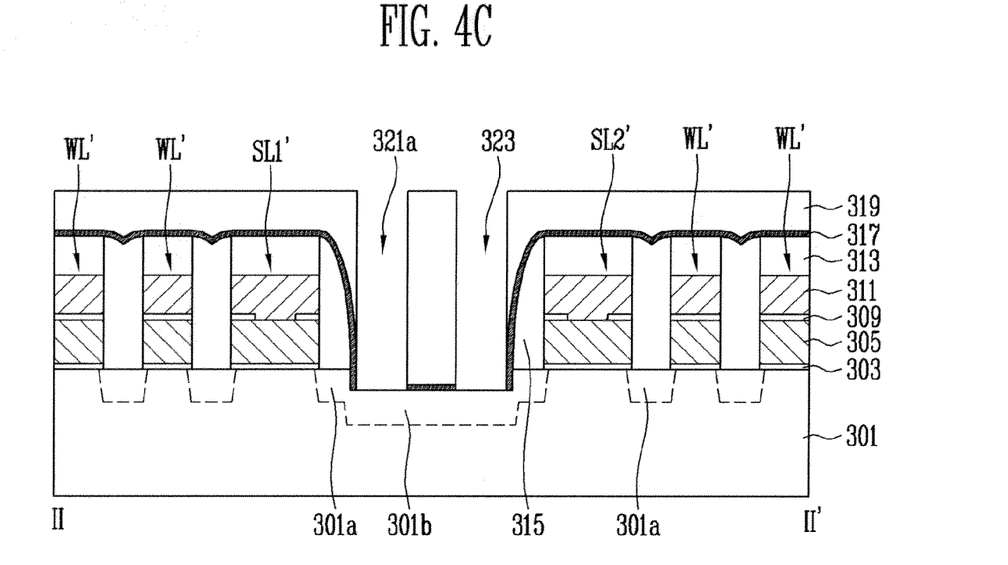

Referring to FIGS. 3 and 4C, after the impurity ions for forming the second junction 301b are implanted, a process of diffusing the impurity ions into the first junction 301a between the first contact hole 321a and the dummy hole 323 is performed. Accordingly, the second junctions 301b formed at the bottoms of the first contact hole 321a and the dummy hole 323 are coupled together.

The process of diffusing the impurity ions of the second junction 301b into the first junction 301a so that the second junctions 301b formed at the bottoms of the first contact hole 321a and the dummy hole 323 are coupled together, as described above, preferably is performed using an annealing process in a temperature range of 600° C. to 700° C. Through the annealing process, the impurity ions of the first junction 301a and the cell junction 301L can be diffused and overlapped with one side of the word lines WL'.

Although the depth of the first junction 301a is shallow to reduce the short channel effect, the loss of the first junction 301a can be compensated for through the second junction 301b formed as described above. Furthermore, since the second junction 301b is formed at the intermediate portion of the first junction 301a, the loss of both sides of the first junction 301a can be compensated for at the same time.

Figure 4D:
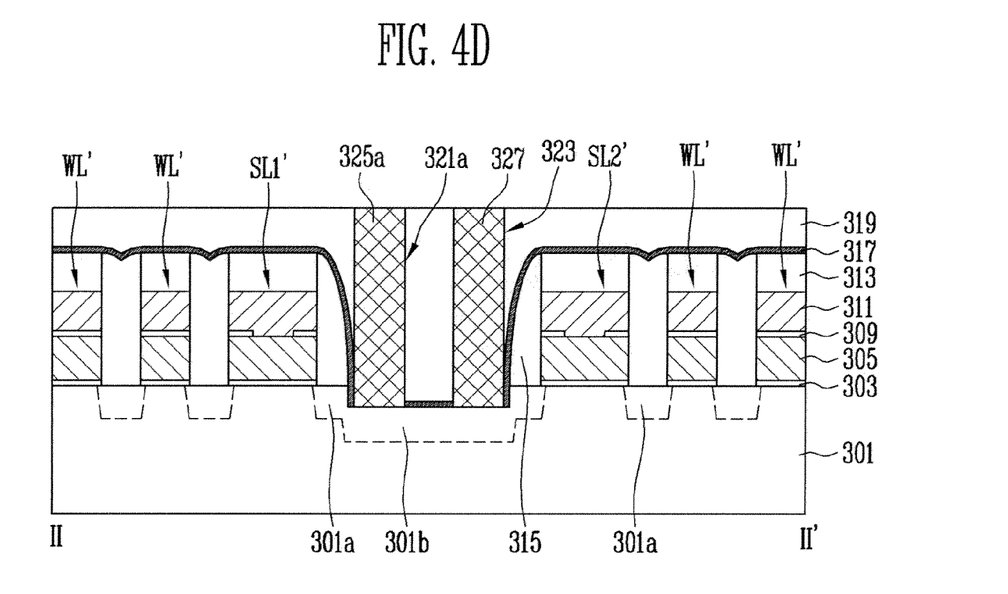

Referring to FIGS. 3 and 4D, conductive material having a thickness enough to fill the first contact hole 321a and a dummy hole 327 is formed on the first interlayer dielectric layer 319. A polishing process is then performed until the first interlayer dielectric layer 319 is exposed. The polishing process can be performed using a chemical mechanical polishing (hereinafter referred to as a 'CMP') method. After the polishing process, a first contact plug 325a to fill the inside of the first contact hole 321a and the dummy plug 327 to fill the inside of the dummy hole 323 are formed.

Figure 4E:
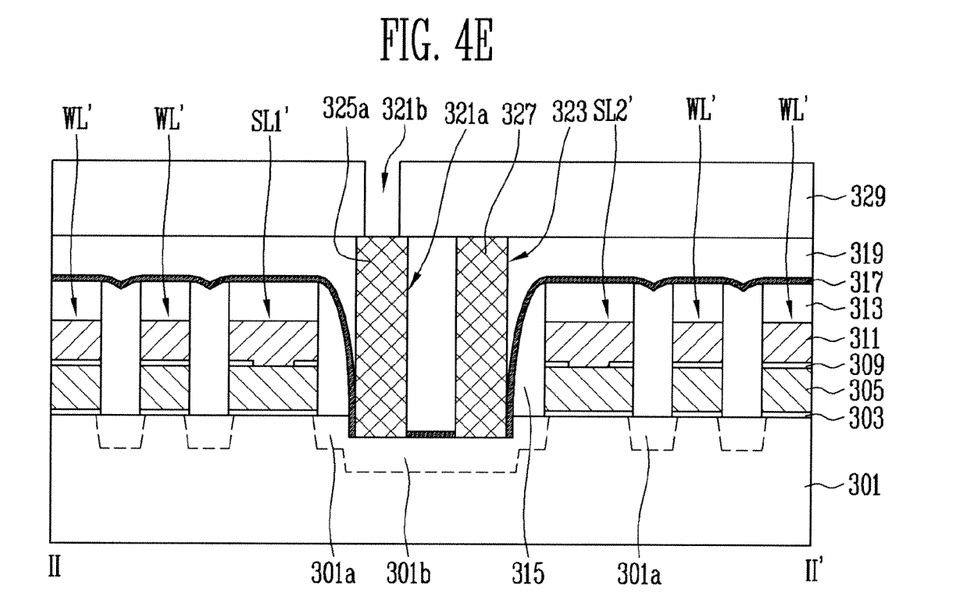

Referring to FIGS. 3 and 4E, a second interlayer dielectric layer 329 is formed over the first interlayer dielectric layer 319, including the first contact plug 325a and the dummy plug 327. The second interlayer dielectric layer 329 preferably is an oxide layer.

A second contact hole 321b to expose the first contact plug 325a is formed by etching the second interlayer dielectric layer 329 formed on the first contact plug 325a. The second contact hole 321b preferably is formed through an etch process using the photoresist pattern, patterned through the photolithography process, as an etch barrier.

Figure 4F:
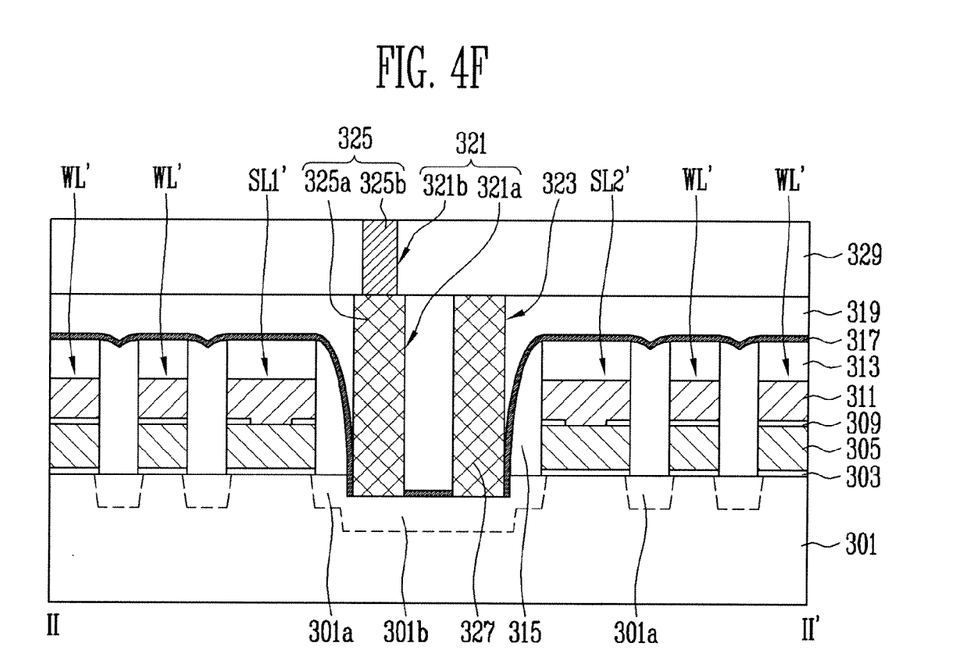

Referring to FIGS. 3 and 4F, conductive material having a thickness enough to fill the second contact hole 321b is formed on the second interlayer dielectric layer 329. A polishing process is then performed until the second interlayer dielectric layer 329 is exposed. The polishing process preferably is performed using a CMP method. After the polishing process, a second contact plug 325b to fill the inside of the second contact hole 321b is formed.

Figure 4G:
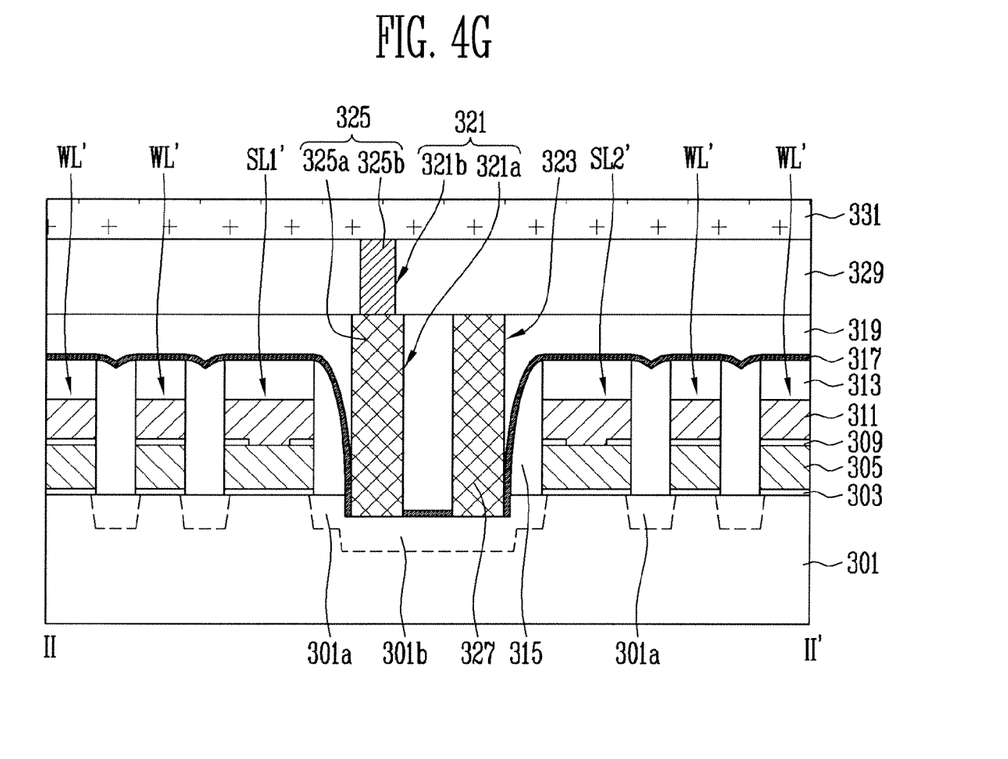

Referring to FIGS. 3 and 4G, the signal line 331 coupled to a contact plug 325, including the first and second contact plugs 325a, 325b, is formed over the second interlayer dielectric layer 329. The signal line 331 is electrically coupled to the contact plug 325 formed higher than the dummy plug 327, but is insulated from the dummy plug 327 because it is formed with the second interlayer dielectric layer 329 interposed between the signal line 331 and the dummy plug 327.

As described above, in the exemplary embodiments of the disclosure, impurity ions are implanted through the first contact hole 321a formed on one side of the first junction 301a. Furthermore, impurity ions are implanted into the other side of the first junction 301a through the dummy hole 323 which is formed in the process of forming the first contact hole 321b. Thus, the second junction 301b preferably is formed in the intermediate portion of the first junction 301a. Accordingly, in the exemplary embodiments of the disclosure, although the first contact hole 321a is formed only on one side of the first junction 301a, loss occurring on the other side of the first junction 301b can be compensated for. Consequently, passage of current to a string structure coupled to the other side of the first junction 301a can be facilitated.

In the exemplary embodiments of the disclosure, although the first junction between the selection lines in the process of forming the spacers is lost, the loss of the first junction can be compensated for by further forming the second junction.

Furthermore, in the exemplary embodiments of the disclosure, the second junction is formed by implanting impurity ions through the contact hole to define the region in which the contact plug is formed. Accordingly, the loss of the first junction can be compensated for without an additional mask process.

Furthermore, in the case in which contact holes are not arranged in a row in order to prevent a bridge between contact plugs, impurity ions are implanted into one sides of the first junctions through the contact holes, and impurity ions are implanted into the other sides of the first junctions through the dummy holes. Accordingly, the second junctions preferably are formed in the respective intermediate portions of the first junctions. Although the contact holes are formed only on one sides of the first junctions, loss occurred in the other sides of the first junctions can be compensated for through the dummy holes. Accordingly, passage of current to a string structure coupled to the other side of the first junction can be further increased.

What is claimed is:

1. A nonvolatile memory device, comprising:
    a semiconductor substrate comprising parallel, alternating active and isolation regions;
    first and second selection lines intersecting the active and isolation regions;
    first junctions formed in the active regions between the first and second selection lines;
    spacers formed on sidewalls of the first and second selection lines;
    second junctions deeper than the first junctions formed in the respective first junctions;
    contact plugs coupled to a first side of the respective second junctions; and
    dummy plugs coupled a second side of the respective second junctions.

2. The nonvolatile memory device of claim 1, further comprising bit lines electrically coupled to the contact plugs and insulated from the dummy plugs.

3. The nonvolatile memory device of claim 2, further comprising an interlayer dielectric layer formed between the dummy plugs and the bit lines.

4. The nonvolatile memory device of claim 1, wherein each of the contact plugs comprises:
    a first contact plug comprising a first contact hole to expose the first side of the second junction and filling the first contact hole of a first interlayer dielectric layer to fill a space between the first and second selection lines; and
    a second contact plug comprising a second contact hole to expose the first contact plug and filling the second contact hole of a second interlayer dielectric layer formed over the first interlayer dielectric layer.

5. The nonvolatile memory device of claim 1, wherein each of the dummy plugs comprises a dummy hole to expose the second side of the second junction and fills the dummy hole of a first interlayer dielectric layer to fill a space between the first and second selection lines.

6. The nonvolatile memory device of claim 1, wherein the contact plugs are higher than the dummy plugs.

7. The nonvolatile memory device of claim 1, wherein:
    the contact plugs and the dummy plugs are formed in each of the active regions between the first and second selection lines, and
    the contact plugs and the dummy plugs formed between the first and second selection lines are alternately adjacent to the first selection line and the second selection line.

8. A method of manufacturing a nonvolatile memory device, the method comprising:
    providing a semiconductor substrate comprising parallel, alternating active and isolation regions;
    forming first and second selection lines intersecting the active regions and the isolation regions;
    forming first junctions in the active regions between the first and second selection lines using the first and second selection lines as a mask;
    forming spacers on sidewalls of the first and second selection lines; forming second junctions deeper than the respective first junctions in the first junctions; and forming contact plugs coupled to a first side of the respective second junctions, and dummy plugs coupled a second side of the respective second junctions.

9. The method of claim 8, comprising forming second junctions deeper than the first junctions in the respective first junctions by:
   forming, over the first junctions, a first interlayer dielectric layer comprising a first contact hole to expose the first side of the second junction and a dummy hole to expose the second side of the second junction and filling a space between the first and second selection lines; and
   implanting impurity ions into the first junctions exposed through the first contact holes and the dummy holes.

10. The method of claim 9, comprising forming second junctions deeper than the first junctions in the respective first junctions by diffusing impurity ions into the first junctions between the first contact hole and the dummy hole.

11. The method of claim 10, wherein diffusing the impurity ions into the first junctions between the first contact hole and the dummy hole comprises performing an annealing process in a temperature range of 600° C. to 700° C.

12. The method of claim 8, wherein forming contact plugs coupled to the first side of the respective second junctions, and dummy plugs, coupled to the second side of the respective second junctions, comprises:
   forming, over the first junctions, a first interlayer dielectric layer comprising first contact holes, each first contact hole exposing the first side of the second junction, and dummy holes, each dummy hole exposing the second side of the second junction, and filling a space between the first and second selection lines;
   forming first contact plugs filling the respective first contact holes and the dummy plugs filling the respective dummy holes;
   forming a second interlayer dielectric layer comprising second contact holes exposing the respective first contact plugs, over the first interlayer dielectric layer comprising the first contact plugs and the dummy plugs; and
   forming second contact plugs filling the respective second contact holes.

13. The method of claim 12, further comprising forming a bit line coupled to the first and second contact plugs over the second interlayer dielectric layer.

14. The method of claim 8, wherein the contact plugs are higher than the dummy plugs.

15. The method of claim 8, wherein:
   the contact plugs and the dummy plugs are formed in each of the active regions between the first and second selection lines, and
   the contact plugs and the dummy plugs formed between the first and second selection lines are alternately adjacent to the first and second selection lines.

* * * * *